United States Patent
Jiang et al.

(10) Patent No.: US 10,664,079 B2
(45) Date of Patent: May 26, 2020

(54) TOUCH PANEL COMPRISING PIEZOELECTRIC POWER GENERATING COMPONENTS, METHOD FOR MANUFACTURING THE SAME AND TOUCH DISPLAY PANEL

(71) Applicants: BOE Technology Group Co., Ltd., Beijing (CN); Hefei Xinsheng Optoelectronics Technology Co., Ltd., Hefei (CN)

(72) Inventors: Liangliang Jiang, Beijing (CN); Lv Cheng, Beijing (CN); Ke Dai, Beijing (CN); Yong Jun Yoon, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 423 days.

(21) Appl. No.: 15/296,125

(22) Filed: Oct. 18, 2016

(65) Prior Publication Data
US 2017/0220160 A1    Aug. 3, 2017

(30) Foreign Application Priority Data
Feb. 1, 2016   (CN) .......................... 2016 1 0070583

(51) Int. Cl.
*G06F 3/041* (2006.01)
*B32B 7/04* (2019.01)
(Continued)

(52) U.S. Cl.
CPC .............. *G06F 3/0412* (2013.01); *B32B 7/04* (2013.01); *G02F 1/13338* (2013.01);
(Continued)

(58) Field of Classification Search
CPC ...................................................... G06F 3/041
See application file for complete search history.

(56) References Cited

U.S. PATENT DOCUMENTS

| | | | |
|---|---|---|---|
| 2004/0051422 A1* | 3/2004 | Kashiwaya | ......... H01L 41/1875 310/324 |
| 2008/0180584 A1 | 7/2008 | Utsunomiya et al. | |

(Continued)

FOREIGN PATENT DOCUMENTS

| | | | |
|---|---|---|---|
| CN | 101236319 A | 8/2008 | |
| CN | 101859731 | * 10/2010 | ........... H01L 21/782 |

(Continued)

OTHER PUBLICATIONS

Jan. 3, 2018—(CN) First Office Action Appn 201610070583.4 with English Tran.

(Continued)

*Primary Examiner* — William Boddie
*Assistant Examiner* — Andrew B Schnirel
(74) *Attorney, Agent, or Firm* — Banner & Witcoff, Ltd.

(57) ABSTRACT

A touch panel, a method for manufacturing the same and a touch display panel are disclosed. The touch panel includes a touch region and a peripheral region, the touch region includes a touch structure disposed on a base substrate; the peripheral region includes a plurality of piezoelectric power generating components disposed on the base substrate, the piezoelectric power generating components are configured for providing energy at least to the touch structure; and each of the piezoelectric power generating component includes a first electrode, a second electrode and a power generating layer disposed between the first electrode and the second electrode, and the power generating layer is of a piezoelectric material.

16 Claims, 4 Drawing Sheets

(51) Int. Cl.
  *G02F 1/1333* (2006.01)
  *G06F 3/044* (2006.01)
  *H01L 27/32* (2006.01)

(52) U.S. Cl.
  CPC ............ *G06F 3/044* (2013.01); *H01L 27/323* (2013.01); *B32B 2457/208* (2013.01); *G02F 2001/133394* (2013.01); *G06F 2203/04103* (2013.01); *G06F 2203/04107* (2013.01); *G06F 2203/04111* (2013.01)

(56) References Cited

U.S. PATENT DOCUMENTS

| | | | | |
|---|---|---|---|---|
| 2011/0109201 | A1* | 5/2011 | Ozawa | G06F 3/0202 310/339 |
| 2013/0120284 | A1* | 5/2013 | Chen | G09G 3/3611 345/173 |
| 2014/0111456 | A1* | 4/2014 | Kashiwa | G06F 3/0414 345/173 |
| 2015/0062525 | A1* | 3/2015 | Hirakata | G02F 1/133305 349/158 |
| 2015/0070305 | A1* | 3/2015 | Seo | G06F 3/0412 345/174 |
| 2015/0220202 | A1 | 8/2015 | Choung et al. | |
| 2016/0370892 | A1* | 12/2016 | Chang | G06F 3/0416 |

FOREIGN PATENT DOCUMENTS

| | | | | |
|---|---|---|---|---|
| CN | 101859731 | A | 10/2010 | |
| CN | 103092426 | A | 5/2013 | |
| CN | 103677426 | A | 3/2014 | |
| CN | 103718450 | A | 4/2014 | |
| CN | 104820510 | A | 8/2015 | |
| KR | 20140012410 | * | 2/2014 | ............ G06F 3/041 |
| KR | 1020140012410 | A | 2/2014 | |

OTHER PUBLICATIONS

Jan. 4, 2019—(CN) Third Office Action Appn 201610070583.4 with English Translation.

\* cited by examiner

A-A 211 213 212

A-A 211 213 212

TOUCH PANEL COMPRISING PIEZOELECTRIC POWER GENERATING COMPONENTS, METHOD FOR MANUFACTURING THE SAME AND TOUCH DISPLAY PANEL

This application claims priority to and the benefit of Chinese Patent Application No. 201610070583.4 filed on Feb. 1, 2016, which application is incorporated herein in its entirety.

TECHNICAL FIELD

Embodiments of the disclosure relate to a touch panel, a method for manufacturing the same and a touch display panel.

BACKGROUND

With the development of display technologies, touch panel technologies are being rapidly developed. Capacitive display panels are enjoying more and more attentions as they have advantages such as precise and sensitive positioning, excellent touch experience and long life span. Currently, touch panels are mostly add-on touch panels.

Moreover, to improve the responsiveness of the touch panel and the precision of touch position, complicated response mechanism and algorithms are used, which will make related IC consume more power. Such power consumption therefore significantly decreases usage time of the touch panel. As a result, improving usage time of touch display panels has become a hot research topic in the industry.

SUMMARY

Embodiments of the disclosure provide a touch panel, a method for manufacturing the same and a touch display panel, which can increase the usage time of the touch display panel.

An embodiment of the disclosure provides a touch panel comprising a touch region and a peripheral region, the touch region comprising a touch structure disposed on a base substrate; the peripheral region comprises a plurality of piezoelectric power generating components disposed on the base substrate, the piezoelectric power generating components are configured for providing energy at least to the touch structure; and each of the piezoelectric power generating component comprises a first electrode, a second electrode and a power generating layer disposed between the first electrode and the second electrode, and the power generating layer is of a piezoelectric material.

Another embodiment of the disclosure provides a method for manufacturing a touch panel, comprising: forming a touch structure on a base substrate in a touch region, and forming a plurality of piezoelectric power generating components on the base substrate in a peripheral region, the piezoelectric power generating components being configured for providing energy at least to the touch structure. Forming each of the piezoelectric power generating components comprises: forming a first electrode and a second electrode through a patterning process; and forming a power generating layer disposed between the first electrode and the second electrode through a printing process, the power generating layer being of a piezoelectric material.

Still another embodiment of the disclosure provides a touch display panel comprising a display panel and the above-described touch panel, and the touch panel is disposed on a light emitting side of the display panel.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
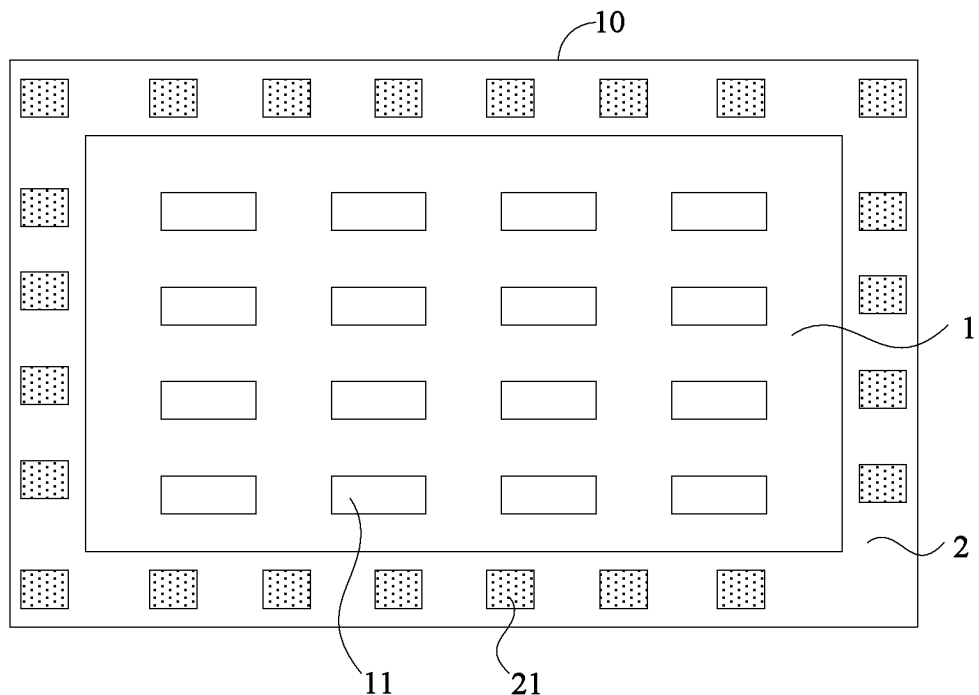
FIG. 1 schematically illustrates a top view of a touch panel in accordance with an embodiment of the disclosure.

An embodiment of the disclosure provides a touch panel 01 as illustrated in FIG. 1, which comprises a touch region 1 and a peripheral region 2; the touch region 1 comprises a touch structure 11 disposed on a base substrate 10, and the peripheral region 2 comprises a plurality of piezoelectric power generating components 21 disposed on the base substrate 10, and the piezoelectric power generating components 21 are configured for providing energy at least to the touch structure 11. Herein each of the piezoelectric power generating components 21 comprises a first electrode, a second electrode and a power generating layer disposed between the first electrode and the second electrode, and the power generating layer is formed of a piezoelectric material.

It should be noted that: first of all, the peripheral region 2 is located at an outer peripheral of the touch region 1, and for example, the touch region 1 is surrounding by the peripheral region.

Secondly, the touch structure 11 will not be limited or restricted in terms of its specific structure, as long as touch positions of touches by fingers can be identified. A person skilled in the related art will understand that no matter what type the touch structure 11 is, the identification of the touch position is made possible only by supplying energy to the touch structure.

Based on different touch structures 11, the identification of the touch position may be based on a mode of current change or capacitance change.

When the mode of current change is used, as a finger touches the touch panel, a coupling capacitor will be formed between the finger and the touch structure 11 due to a body electric field. Currents flow to the touched point will be generated by the strip electrodes at the four surrounding sides or corners will, and intensities of the currents are in reverse proportional to the distances between the finger and the strip electrodes at the four surrounding sides or corners. A controller connected to the touch panel will then precisely compute the position of the touched point by calculating the ratios and intensities of the currents.

As for the mode of capacitance change, when the finger touches the touch panel, the body electric field will act on self-capacitance or mutual capacitance of the touch structure 11, changing the value of the capacitance, thereby determining the location of the touched pointed.

Thirdly, the piezoelectric effect refers to a phenomenon where a crystalline material generates a voltage under an external mechanical pressure. For example, polarization will happen to some crystalline materials when external forces along a direction are applied to the materials and causing deformation thereto. At the same time, positive and negative charges are generated on two opposite surface thereof. When the external force is removed, the material will recover to the state with no charges.

In the embodiment, a piezoelectric material which can generate a voltage under an external mechanical force (such as push, press, stretch and the like) and recover to the state with no charges such as a conductive polymer material can be applied.

In the embodiment of the disclosure, when the finger touches the touch region 1 of the touch panel 01, the touch panel 01 will be deformed. When the touch panel 01 is deformed, a mechanical force will be applied to the piezoelectric material, allowing the piezoelectric material to generate charges.

In addition to that, the first electrode and the second electrode will not be limited in terms of their materials, as long as charges generated when the piezoelectric material is deformed can be collected and output in the form of voltage. Based on different piezoelectric materials, the first and second electrodes may be disposed on the same or different layers.

In at least some embodiments, to output the collected charges, the touch panel may further comprise electrode wires respectively connected to the first and second electrodes. The electrode wires may be used to output the collected voltage to an accumulator, which is an energy storage device. The accumulator may be used to provide energy to the touch structure. The accumulator may be disposed on a PCB of the touch panel.

The embodiment of the disclosure provides a touch panel 01. By providing piezoelectric power generating components 21 in the peripheral region 2, the deformation caused to the touch panel 01 when touch happens in the touch region 1 may be used to cause the piezoelectric power generating components 21 to generate powers (electricity), thereby providing energy to the touch structure 11 of the touch region 1. It can even be used to provide power to the display panel when being applied to the touch display panel, thereby extending the usage time of the touch display panel. Moreover, as the force applied to the touch panel 01 is limited, the mechanical force applied to the piezoelectric material will not be too high as to damage the piezoelectric power generating components 21, allowing the piezoelectric power generating components 21 to have a long life span.

Figure 2:
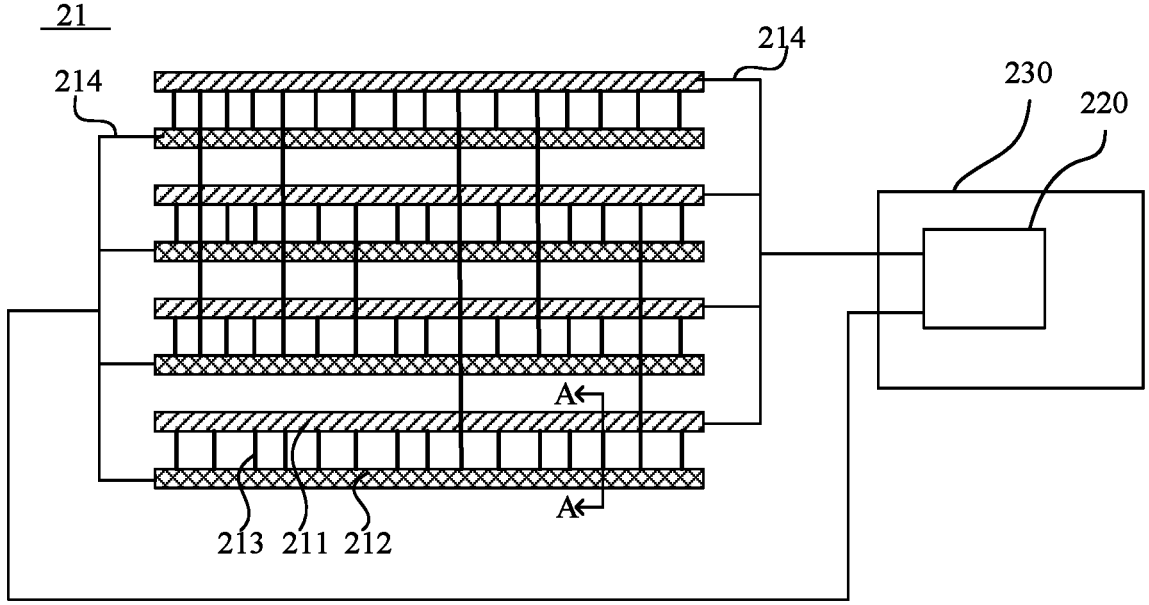
FIG. 2 schematically illustrates a configuration of a piezoelectric power generating component in accordance with an embodiment of the disclosure.

In at least some embodiments, at illustrated in FIG. 2, a first electrode 211 and a second electrode 212 are parallel to each other and disposed in a same layer. For example, the power generating layer comprises a zinc oxide nanowire array, the zinc oxide nanowire array comprises a plurality of zinc oxide nanowires 213, one end of each of the zinc oxide nanowires 213 is in contact with the first electrode 211, and the other end thereof is in contact with the second electrode 212.

As an example, in the peripheral region 2 close to any side of the touch region 1, first electrodes 211 and second electrodes 212 of all piezoelectric power generating components 21 are disposed in parallel and equally spaced apart from each other. It can be understood that a plurality of piezoelectric power generating components 21 may be disposed in the peripheral region 2 on one side of the touch region, or in the peripheral region 2 on two opposite sides of the touch region. In at least some embodiments, the piezoelectric power generating components 21 are disposed in the peripheral region 2 on at least one side of the touch region.

Figure 3A:
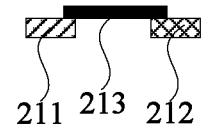
FIG. 3a schematically illustrates a zinc oxide nanowire with no deformation along AA direction of FIG. 2.

When no mechanical force is applied to the zinc oxide nanowires 213, that is, when no force is applied to the touch panel 01, for example when no touch operation is present, as illustrated in FIG. 3a, the zinc oxide nanowires 213 are not deformed, neither will positive or negative charges be generated at both ends of the zinc oxide nanowires 213.

Figure 3B:
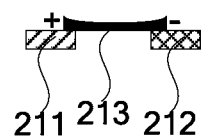
FIG. 3b schematically illustrates a zinc oxide nanowire with deformation along AA direction of FIG. 2.

When a touch operation happens, the zinc oxide nanowires 213 are deformed under the mechanical force. As illustrated in FIG. 3b, positive or negative charges will be generated at both ends of the zinc oxide nanowires 213. At this time, the first electrode 211 and the second electrode 212 can collect the positive or negative charges and output them in a form of voltage. As illustrated in FIG. 2, the electrode wires 214 respectively connected to the first electrode 211 and the second electrode 212 may output the collected voltage to the accumulator.

It is noted that the zinc oxide nanowire array may be a collection of zinc oxide nanowires having a same orientation. In the embodiment of the disclosure, for example, the zinc oxide nanowires are oriented vertically to an extending direction of the first electrode 211.

As an example, the distance between the first electrode 211 and the second electrode 212 may be from 5 μm to 15 μm, for example 10 μm. That is, the height of the zinc oxide nanowires 231 may be from 5 μm to 15 μm, for example 10 μm. Widths of the first electrode 211 and the second electrode may be from 3 μm to 8 μm, for example 5 μm.

By configuring the distance between the first electrode 211 and the second electrode 212 to be from 5 μm to 15 μm, more piezoelectric power generating components may be disposed in the peripheral region 2, thereby generating more electric power. By configuring the widths of the first electrode 211 and the second electrode to be from 3 μm to 8 μm, a high response precision can be obtained and the process difficulty can be decreased.

Figure 4:
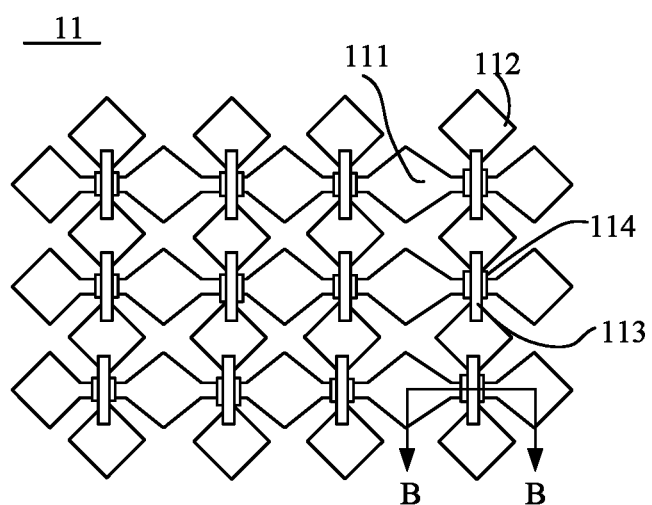
FIG. 4 schematically illustrates a top view of a touch structure in accordance with an embodiment of the disclosure.

In at least some embodiments, as illustrated in FIG. 4, the touch structure 11 comprises a first touch electrode and a second touch electrode disposed intersecting each other. The first touch electrode comprises a plurality of first touch sub-electrodes 111 directly connected to each other, the second touch electrode comprises a plurality of second touch sub-electrodes 112, and a second touch sub-electrode 112 is connected to an adjacent second touch sub-electrode 112 via a bridge 113. The first and second touch electrodes are insulated from each other.

In at least some embodiments, in order to guarantee the precise identification of the touched position, sheet resistances of the first touch sub-electrodes 111 and the second touch sub-electrodes 112 may be 60±15 Ω/cm$^2$.

It should be noted that the material of the first touch sub-electrodes 111 or the second touch sub-electrodes 112 may be a transparent material such as indium tin oxide (ITO). The first touch sub-electrodes 111 and the second touch sub-electrodes 112 may be formed through a single patterning process.

Moreover, the material of the bridge 113 may be a conductive metal or a transparent conductive material. For example, the material of the bridge 113 is a conductive metal material, for example, aluminum or aluminum alloy.

Moreover, the bridge 113 and the first touch electrode may be insulated from each other by providing a whole layer of insulating layer therebetween or providing insulating blocks 114 at overlapping positions therebetween only.

The embodiment of the disclosure realizes precise identification of the touched position by providing the first touch electrode and the second touch electrode.

Figure 8:
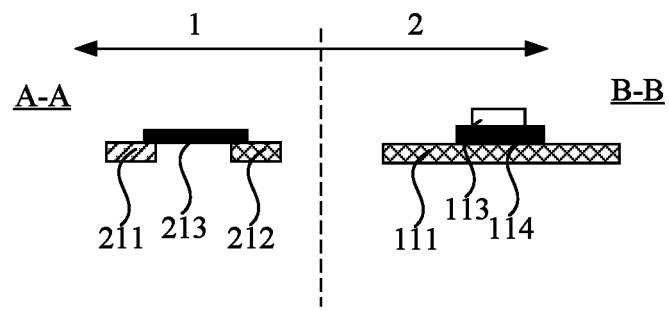
FIG. 8 schematically illustrates a cross-section of a touch display panel along AA direction of FIG. 2 and BB direction of FIG. 4 in accordance with an embodiment of the disclosure.

In at least some embodiments, as illustrated in FIG. 8, the first electrode 211 and second electrode 212 are disposed on a same layer as the first touch sub-electrodes 111. In at least some embodiments, as illustrated in FIG. 9, the first electrode 211 and second electrode 212 are disposed on a same layer as the bridge 113.

That is, the first electrode 211 and second electrode 212 as well as the first touch sub-electrodes 111 are formed through a single patterning process. Or, the first electrode 211 and the second electrode 212 as well as the bridge 113 are formed through a single patterning process, thereby avoiding increasing patterning processes.

Figure 9:
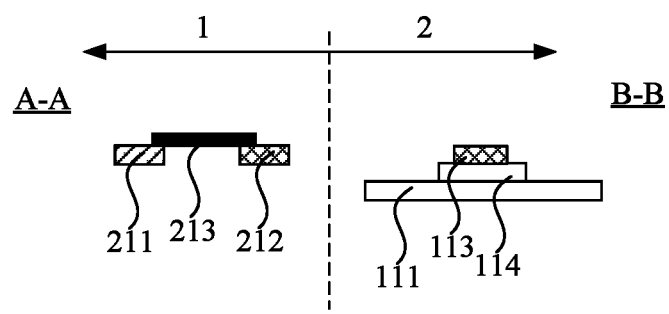
FIG. 9 schematically illustrates a cross-section of a touch display panel along AA direction of FIG. 2 and BB direction of FIG. 4 in accordance with another embodiment of the disclosure.

In at least some embodiments, considering that the conductivity of a metal conductive material is higher than that of a transparent conductive material, when the bridge is formed of a metal conductive material, the first electrode 211 and the second electrode 212 as well as the bridge 113 are disposed in the same layer, as illustrated in FIG. 9.

Figure 5:
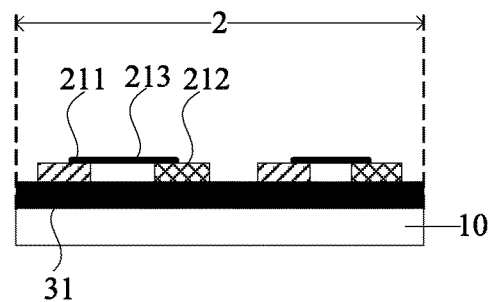
FIG. 5 schematically illustrates a cross-section of a peripheral region in accordance with an embodiment of the disclosure.
Figure 6:
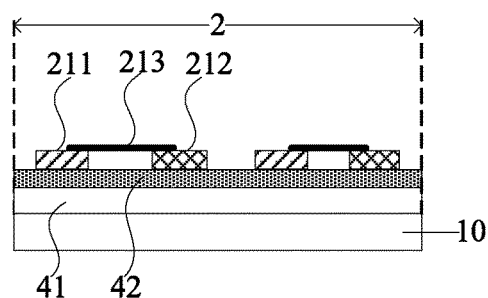
FIG. 6 schematically illustrates a cross-section of another peripheral region in accordance with an embodiment of the disclosure.

In at least some embodiments, as illustrated in FIG. 5 or 6, the peripheral region 2 may further comprise an insulation layer, for example, a color insulation layer such as a black photoresist layer 31 or a white photoresist layer 41, which may be in contact with the base substrate 10.

As the white photoresist layer 41 is of a small optical density, it cannot shield light completely. In this case, if the white photoresist layer 41 is used, the peripheral region 2 may further comprise a light-shielding layer 42 disposed on a side, away from the base substrate 10, of the white photoresist layer 41, such that light may be shielded completely.

In the embodiment of the disclosure, disposition of the insulation layer (e.g., the photoresist layer) in the peripheral region 2 on one hand is helpful to shield the first electrode 211, the second electrode 212 and the wirings in the peripheral region and on the other hand functions as decoration.

An embodiment of the disclosure further provides a touch display panel, which comprises a display panel and the above touch panel 01, the touch panel 01 is disposed on a light-emitting side of the display panel.

Figure 7:
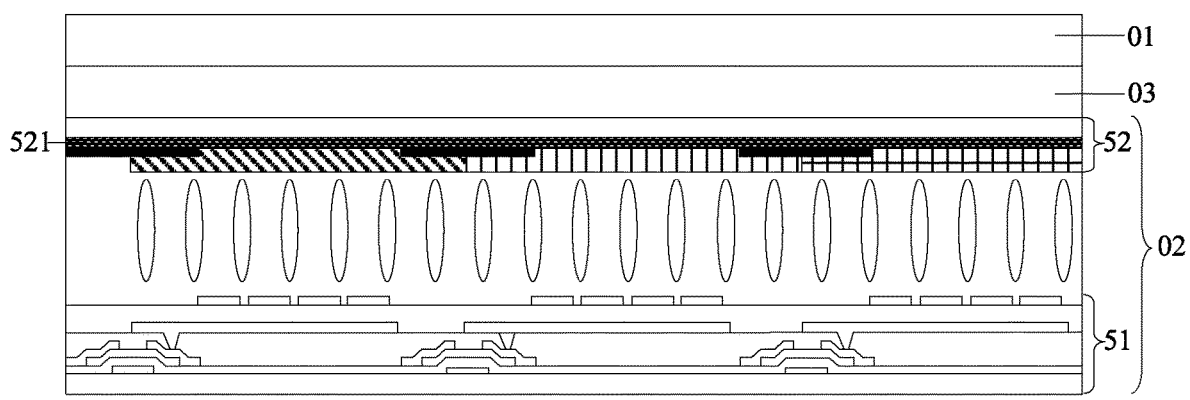
FIG. 7 schematically illustrates a cross-section of a configuration of a touch display panel in accordance with an embodiment of the disclosure.

The display panel may be an LCD panel 02 as illustrated in FIG. 7 or an OLED display panel, or any other display panels for displaying.

In at least some embodiments, the touch panel and the display panel may be bonded using an optical clear adhesive (OCA), e.g., optical clear resin (OCR) 03.

The embodiment of the disclosure provides a touch display pane; piezoelectric power generating components 21 are provided in the peripheral region 2 of the touch panel 01, the deformation caused to the touch panel 01 when a touch operation by a finger for example happens in the touch region 1 can cause the piezoelectric power generating components 21 to generate electric power, thereby providing energy to the touch structure 11 of the touch region 1. It can even be used to provide electric power to the display panel, thereby extending the usage time of the touch display panel. Moreover, as the force applied to the touch panel 01 is limited, the mechanical force applied to the piezoelectric material will not be too high as to damage the piezoelectric power generating components 21, allowing the piezoelectric power generating components 21 to have a long life span.

In at least some embodiments, as illustrated in FIG. 7, the display panel may comprise a first substrate 51 and a second substrate 52 that are cell-assembled together to form a cell; the second substrate 52 is disposed close to the touch panel 01. The first substrate 51 is for example a thin film transistor (TFT) array substrate, and the second substrate 52 is for example a color filter substrate, with a liquid crystal layer formed between the two.

In at least some embodiments, the second substrate 52 comprises a shielding layer 521, which is disposed on a surface of a base substrate of the second substrate 52 and completely overlays or covers the base substrate.

As an example, the shielding layer may be electrically grounded.

Herein the shielding layer 521 may be of a conductive material, such as molybdenum, copper, indium tin oxide and the like. In at least some embodiment, to prevent the shielding layer 521 from affecting light emission from the display panel, a transparent conductive material such as ITO may be used. When a metal material is used, the shielding layer 521 may be made into a thinner film so as to guarantee light transmission.

In the embodiment of the disclosure, the shielding layer 521 is provided. When the electric field reaches the shielding layer 521, it will be shield due to the short-circuiting effect of the conductive shielding layer 521. As a result, the electric field cannot pass the shielding layer. In this way, when the display panel displays, the shielding layer 521 can shield the impact from the electric field signals on the touch panel. It can also prevent the impact of the electric field on the display panel when touch is present on the touch panel.

In at least some embodiments, the touch display panel further comprises an accumulator for collecting energy generated by the piezoelectric power generating components 21 in the touch panel 01, and for supplying energy at least to the touch structure 11 in the touch panel 01. It may also supply energy to the display panel.

Herein, as illustrated in FIG. 2, the accumulator 220 may be integrated into a PCB 230 of the touch display panel, which may be configured as needed.

An embodiment of the disclosure further provides a method for manufacturing a touch panel. With reference to FIG. 1, the method comprises: forming a touch structure 11 on a base substrate 10 in a touch region 1, and forming a plurality of piezoelectric power generating components 21 on the base substrate 10 in a peripheral region 2. The piezoelectric power generating components 21 are configured for providing energy at least to the touch structure 11. The configuration of the touch panel can be referred to the above embodiment.

Referring to FIG. 2, the step of forming each of the piezoelectric power generating components 21 may comprise the following operations: forming a first electrode 211 and a second electrode 212 which are in parallel and disposed on a same layer through a patterning process; forming a power generating layer through a printing process. The power generating layer may comprise a zinc oxide nanowire array, one end of each of the zinc oxide nanowires 213 of the zinc oxide nanowire array is in contact with the first electrode 211, and the other end thereof is in contact with the second electrode 212.

In at least some embodiments, the distance between the first electrode 211 and the second electrode 212 may be from 5 µm to 15 µm. Widths of the first electrode 211 and the second electrode 212 may be from 3 µm to 8 µm.

By configuring the distance between the first electrode 211 and the second electrode 212 to be in the range from 5 µm to 15 µm, more piezoelectric power generating components may be disposed in the peripheral region 2, thereby generating more electric power. By configuring the widths of the first electrode 211 and the second electrode to be in the range from 3 µm to 8 µm, a high response precision can be obtained and the process difficulty can be decreased.

When no mechanical force is applied to the zinc oxide nanowires 213, that is, when no force is applied to the touch panel 01, for example when no touch is present, as illustrated in FIG. 3a, the zinc oxide nanowires 213 are not deformed, neither will positive or negative charges be generated at both ends of the zinc oxide nanowires 213.

When a touch operation happens, the zinc oxide nanowires 213 are deformed under the mechanical force. As illustrated in FIG. 3b, positive or negative charges will be generated at both ends of the zinc oxide nanowires 213. At this time, the first electrode 211 and the second electrode 212 can collect the positive or negative charges and output them as a voltage. In this way, as illustrated in FIG. 2, the electrode wires 214 respectively connected to the first electrode 211 and the second electrode 212 may output the collected voltage to the accumulator 220.

The embodiment of the disclosure provides a method for manufacturing a touch panel. By configuring piezoelectric power generating components 21 in the peripheral region 2 of the touch panel, the deformation caused to the touch panel 01 when a touch operation happens in the touch region 1 may cause the piezoelectric power generating components 21 to generate electric power, thereby providing energy to the touch structure 11 of the touch region 1. The piezoelectric power generating components 21 can even be used to provide electric power to the display panel when being applied to the touch display panel, thereby extending the usage time of the touch display panel. Moreover, as the force applied to the touch panel 01 is limited, the mechanical force applied to the piezoelectric material will not be too high as to damage the piezoelectric power generating components 21, allowing the piezoelectric power generating components 21 to have a long life span.

In at least some embodiments, as illustrated in FIG. 4, the touch structure 11 comprises a first touch electrode and a second touch electrode that are disposed to intersect each other. The first touch electrode comprises a plurality of first touch sub-electrodes 111 directly connected to each other, the second touch electrode comprises a plurality of second touch sub-electrodes 112, and a second touch sub-electrode 112 is connected to an adjacent second touch sub-electrode 112 via a bridge 113. The first and second touch electrodes are insulated from each other.

In at least some embodiments, the first electrode 211 and second electrode 212 are formed through a single patterning process. As an example, the first electrode 211 and the second electrode 212 as well as the first touch sub-electrodes 111 or the bridge 113 are formed through a single patterning process.

As an example, the material of the first touch sub-electrodes 111 or the second touch sub-electrodes 112 may be a transparent conductive material. A material of the bridge 113 may be a conductive metal or a transparent conductive material. For example, the material of the bridge 113 is a conductive metal material.

In at least some embodiments, considering that the conductivity of a metal conductive material is higher than that of a transparent conductive material, when the bridge is of a metal conductive material, the first electrode 211 and the second electrode 212 as well as the bridge 113 are disposed in the same layer, as illustrated in FIG. 9.

Referring to FIG. 5 or 6, the method further comprises forming a black photoresist layer 31 or a white photoresist layer 41 in contact with the base substrate 10 in the peripheral region.

As the white photoresist layer 41 is of a small optical density, it cannot shield light completely. In this case, if the white photoresist layer 41 is used, the peripheral region 2 may further comprise a light-shielding layer 42 disposed on a side, away from the base substrate 10, of the white photoresist layer 41, such that light may be shielded completely.

In the embodiment of the disclosure, disposition of the photoresist layer in the peripheral region 2 on one hand helps to shield the first electrode 211, the second electrode 212 and the wirings in the peripheral region and on the other hand functions as decoration.

In the following, a specific embodiment will be described to illustrate the method for manufacturing a display panel. The method comprises the following operations:

S10, with reference to FIG. 5, a black photoresist layer 31 is formed on the base substrate 10 in the peripheral region 2.

For example, a layer of black photoresist film may be applied to the base substrate 10 first. The black photoresist film may be of a thickness of for example 1.5 μm. After that, the black photoresist layer 31 is formed in the peripheral region 2 through exposing and developing processes.

S11, with reference to FIG. 4, a first touch electrode comprising a plurality of directly connected first touch sub-electrodes 111 is formed in the touch region, and second touch sub-electrodes 112 are formed.

As an example, the second touch sub-electrodes are arranged into columns, second touch sub-electrodes 112 in each column are disposed on both side of a connection portion between adjacent first touch sub-electrodes 111. For example, the first touch electrode and the second touch sub-electrodes 112 are made of ITO.

As an example, an ITO film may be formed via a sputtering process. A thickness of the ITO film is 800 Å for example, and its sheet resistance may be made to be 60±15 Ω/cm². After a layer of photoresist is applied and the first touch electrode and the second touch sub-electrodes 112 are formed through exposing, developing and etching processes.

S12, with reference to FIG. 4, an insulating block 114 overlaying the connection portion between adjacent first touch sub-electrodes 11 is formed in the touch region 1.

As an example, the insulating block 114 may be formed by applying a photoresist film layer with a thickness of 1.5 μm first and then having the film layer exposed and developed.

S13, with reference to FIG. 4, in the touch region 1, a bridge connecting adjacent second touch sub-electrodes 112 is formed along a direction vertical to the extension direction of the first touch electrode; with reference to FIGS. 5 and 6, a first electrode 211 and a second electrode 212 in the peripheral region are formed.

The first electrode 211 and the second electrode 212 are in parallel and spaced apart from each other. The distance between the first electrode 211 and the second electrode 212 may be 10 μm, and widths of the first electrode 211 and the second electrode 212 may be 5 μm.

As an example, a metal film may be formed via a sputtering process. A thickness of the metal film is 3,000 Å. After that a layer of photoresist is applied and the first electrode 211 and the second electrode 212 are formed through exposing, developing and etching processes.

S14, with reference to FIGS. 5 and 2, a zinc oxide nanowire array is formed through a patterning process, and an end of a zinc oxide nanowire in the zinc oxide nanowire array is in contact with the first electrode 211 and the other end thereof is in contact with the second electrode 212.

The touch panel 01 may be formed through the above steps S10 to S14. Then, the touch panel 01 can be bonded to a light-emitting side of the display panel using a bonding process, thereby forming the touch display panel.

In the touch panel, the method for manufacturing the same and the touch display panel provided by the above embodiments of the disclosure, by configuring piezoelectric power generating components in the peripheral region, the deformation caused to the touch panel when a touch operation happens in the touch region may be used to cause the piezoelectric power generating components to generate electric powers, thereby providing energy to the touch structure of the touch region. It can even be used to provide power to the display panel when being applied to the touch display panel, thereby extending the usage time of the touch display panel. Moreover, as the force applied to the touch panel is limited, the mechanical force applied to the piezoelectric material will not be too high as to damage the piezoelectric power generating components, allowing the piezoelectric power generating components to have a long life span.

What is described above is related to the illustrative embodiments of the disclosure only and not limitative to the scope of the disclosure; the scopes of the disclosure are defined by the accompanying claims.

The present application claims priority from Chinese Application No. 201610070583.4 filed on Feb. 1, 2016, the disclosure of which is incorporated herein by reference in its entirety

What is claimed is:
1. A touch panel comprising:
a base substrate, comprising a touch region and a peripheral region, the touch region being surrounded by the peripheral region;
a touch structure, disposed in the touch region;
a plurality of piezoelectric power generating components, disposed only in the peripheral region and configured for providing energy at least to the touch structure, wherein each of the piezoelectric power generating components comprises:
a first electrode;
a second electrode, the first electrode and the second electrode being parallel to each other and disposed on a same layer; and
a power generating layer, disposed between the first electrode and the second electrode, wherein the power generating layer is of a piezoelectric material and comprises a zinc oxide nanowire array, wherein the zinc oxide nanowire array comprises:
a plurality of zinc oxide nanowires, wherein one end of each of the plurality of zinc oxide nanowires is in contact with the first electrode, and the other end of each of the plurality of zinc oxide nanowires is in contact with the second electrode; and
a photoresist layer, disposed between the base substrate and each of the piezoelectric power generating components, wherein the photoresist layer is configured for shielding the first electrode and the second electrode in the peripheral region,
wherein each of the piezoelectric power generating components and the touch structure are located on a same side of the base substrate, and an orthographic projection of each of the piezoelectric power generating components on the base substrate is non-overlapped with an orthographic projection of the touch structure on the base substrate.

2. The touch panel of claim 1, wherein a distance between the first electrode and the second electrode is from 5 μm to 15 μm; and widths of the first electrode and the second electrode are from 3 μm to 8 μm.

3. The touch panel of claim 1, wherein the touch structure comprises a first touch electrode and a second touch electrode disposed to intersect each other, wherein the first touch electrode and the second touch electrode are insulated from each other.

4. The touch panel of claim 3, wherein the first touch electrode comprises a plurality of first touch sub-electrodes directly connected to each other, the second touch electrode comprises a plurality of second touch sub-electrodes, wherein adjacent second touch sub-electrodes are connected via a bridge.

5. The touch panel of claim 4, wherein the first electrode and the second electrode are disposed on a same layer as the first touch sub-electrodes.

6. The touch panel of claim 4, wherein the first electrode and the second electrode are disposed on a same layer as the bridge.

7. The touch panel of claim 1, wherein the photoresist layer comprises a black photoresist layer in the peripheral region, wherein the black photoresist layer is in contact with the base substrate.

8. The touch panel of claim 1, wherein the photoresist layer comprises a white photoresist layer in the peripheral region, wherein the touch panel further comprises a light-shielding layer, wherein the light-shielding layer is disposed on a side of the white photoresist layer away from the base substrate.

9. A method for manufacturing a touch panel, comprising:
providing a base substrate, the base substrate comprising a touch region and a peripheral region, the touch region being surrounded by the peripheral region;
forming a touch structure in the touch region of the base substrate;
forming a plurality of piezoelectric power generating components in the peripheral region of the base substrate, the piezoelectric power generating components being configured for providing energy at least to the touch structure; and
forming a photoresist layer between the base substrate and each of the piezoelectric power generating components, wherein the photoresist layer is configured for shielding a first electrode and a second electrode in the peripheral region of the base substrate,
wherein the forming the plurality of piezoelectric power generating components comprises:
forming a first electrode and a second electrode through a single patterning process, the first electrode and the second electrode being parallel to each other and disposed on a same layer; and
forming a power generating layer disposed between the first electrode and the second electrode through a printing process, the power generating layer being of a piezoelectric material and comprising a zinc oxide nanowire array,
the method further comprising forming the zinc oxide nanowire array by:
forming a plurality of zinc oxide nanowires, one end of each of the plurality of zinc oxide nanowires being in contact with the first electrode, and the other end of each of the plurality of zinc oxide nanowires being in contact with the second electrode,
wherein each of the piezoelectric power generating components and the touch structure are located on a same side of the base substrate, and an orthographic projection of each of the piezoelectric power generating components on the base substrate is non-overlapped with an orthographic projection of the touch structure on the base substrate.

10. The method of claim 9, wherein the touch structure comprises a first touch electrode and a second touch electrode disposed to intersect each other,
the first touch electrode comprises a plurality of first touch sub-electrodes directly connected to each other, the second touch electrode comprises a plurality of second touch sub-electrodes, a second touch sub-electrode is connected to an adjacent second touch sub-electrode via a bridge, and the first touch electrode and the second touch electrode are insulated from each other.

11. The method of claim 10, wherein the first electrode and the second electrode as well as the first touch sub-electrodes are formed through a single patterning process.

12. The method of claim 4, wherein the first electrode and the second electrode as well as the bridge are formed through a single patterning process.

13. A touch display panel comprising a display panel and the touch panel of claim 1, wherein the touch panel is disposed on a light emitting side of the display panel.

14. The touch display panel of claim 13, wherein the display panel comprises a first substrate and a second substrate, and the second substrate is disposed close to the touch panel.

15. The touch display panel of claim 14, wherein the second substrate comprises a shielding layer disposed on a surface of a base of the second substrate and completely overlays the base.

16. The touch display panel of claim 13, further comprising an accumulator configured for collecting energy generated by the plurality of piezoelectric power generating components and for supplying energy to the touch structure.

* * * * *